(12) United States Patent
Liufu

(10) Patent No.: US 7,303,692 B2
(45) Date of Patent: Dec. 4, 2007

(54) COMPOSITIONS FOR HIGH POWER PIEZOELECTRIC CERAMICS

(75) Inventor: De Liufu, Westfield, IN (US)

(73) Assignee: Piezotech, LLC, Indianapolis, IN (US)

( * ) Notice: Subject to any disclaimer, the term of this patent is extended or adjusted under 35 U.S.C. 154(b) by 0 days.

(21) Appl. No.: 11/104,373

(22) Filed: Apr. 11, 2005

(65) Prior Publication Data

US 2005/0178997 A1    Aug. 18, 2005

Related U.S. Application Data

(63) Continuation-in-part of application No. 10/686,310, filed on Oct. 15, 2003.

(51) Int. Cl.
C04B 35/493    (2006.01)
(52) U.S. Cl. .............................. 252/62.9 PZ; 501/134; 501/135
(58) Field of Classification Search ......... 252/62.9 PZ; 501/134, 135; 310/311
See application file for complete search history.

(56) References Cited

U.S. PATENT DOCUMENTS

| | | | | |
|---|---|---|---|---|
| 4,948,767 A | * | 8/1990 | Ushida et al. ............... | 501/134 |
| 5,849,211 A | * | 12/1998 | Hase et al. ........... | 252/62.9 PZ |
| 6,140,746 A | | 10/2000 | Miyashita et al. | |
| 6,565,997 B2 | * | 5/2003 | Kashiwaya ................. | 428/701 |
| 6,882,089 B2 | | 4/2005 | Kashiwaya et al. | |

FOREIGN PATENT DOCUMENTS

| | | | |
|---|---|---|---|
| DE | 1646699 | * | 5/1972 |
| EP | 0344978 | | 6/1989 |
| EP | 344978 | * | 12/1989 |

OTHER PUBLICATIONS

Study of $Pb(Ni_{1/3},Nb_{2/3})O_3$—$Pb(Zr,Ti) O_3$ Solid Solutions Near Morphotropic Phase Boundary, G. Robert, M. Demartin and D. Damjanovic.

Structural compositional and piezoelectric properties of the sol-gel $Pb(Zr_{0.56}Ti_{0.44})_{0.80}(Mg_{1/3}Nb_{2/3})_{0.20}O_3/Pb(Zr_{0.56}Ti_{0.44})O_3$ composite films; K. Sumi, H. Qiu, H. Kamei, S. Moriya, M. Murai, M. Shimada, T. Nishiwaki, K. Takei, M. Hashimoto; 1999 Elsevier Science S.A.

Effects of uniaxial stress on dielectric properties lead magnesium niobate-lead zirconate titanate ceramics; R. Yimnirum, S. Ananta, E. Meechoowas, S. Wongsaenmai: Dept. of Physics, Chiang Mai Univ., Chiang Mai 50200 Thailand.

Mechanical Properties of xPMN-(1-x)PZT Ceramic Systems; R. Yimnirum, E. Meechoowas, S. Ananta and T. Tunkasiri; Dept. of Physics, Chiang Mai Univ., Chiang Mai 50200 Thailand.

Structure and the location of the morphotropic phase boundary region in $(1-x)[Pb(Mg_{1/3}Nb_{2/3})O_3]-xPbTiO_3$; A. Singh and D. Pandey; School of Materials and Technology, Institute of technology, Banaras Hindu Univ., Varanasi 221005, India.

Morphotropic phase boundary in $Pb(Ni_{1/3}Nb_{2/3})O_3$-$PbTiO_3$ solid solution system; K. Chen, C. Lei, X Zhang, J. Wang; Materials Science and Engineering B99 (92003) 487 490.

Morphotropic phase transition studies in $Pb(Zr_xTi_{-x})O_3$ b far-infrared reflectance spectroscopy; V. Sivasubramanian, V R K Murthy, B. Viswanathan, M. Sieskind; Dept. of Physics, Indian Institute of Technology, Madras—600 036, India.

* cited by examiner

*Primary Examiner*—C. Melissa Koslow
(74) *Attorney, Agent, or Firm*—Woodard, Emhardt, Moriarty, McNett & Henry LLP

(57) ABSTRACT

Piezoelectric ceramics of the formula $Pb_{(1-z)}M_z(Mg_{1/3}Nb_{2/3})_x(Zr_yTi_{1-y})_{1-x}O_3$ where M can be either Sr or Ba or both, and x is between 0.3 and 0.6, y is between 0.2 and 0.5, and z is between 0.04 and 0.08. The piezoelectric ceramic is provided as a composite perovskite structure, and may additionally include materials or dopants such as: $PbO$, $HfO_2$, $TeO_2$, $WO_3$, $V_2O_5$, $CdO$, $Tm_2O_3$, $Sm_2O_3$, $Ni_2O_3$, and $MnO_2$. The piezoelectric ceramics can be used to fabricate piezoelectric elements for a wide variety of devices that can be fabricated to exhibit high power applications including miniaturized displacement elements, buzzers, transducers, ultrasonic sensors and ultrasonic generators, and the like.

3 Claims, No Drawings

COMPOSITIONS FOR HIGH POWER PIEZOELECTRIC CERAMICS

CROSS-REFERENCE TO RELATED APPLICATIONS

This application is a continuation-in-part of U.S. patent application Ser. No. 10/686,310 filed 15 Oct. 2003, which is hereby incorporated by reference.

FIELD OF THE INVENTION

The present invention relates generally to piezoelectric ceramic compositions, articles formed from these compositions, and to methods for preparing the piezoelectric ceramic compositions and articles.

BACKGROUND TO THE INVENTION

Piezoelectric elements are widely used in a variety of electronic components including ceramic resonators, ceramic filters, piezoelectric displacement elements, buzzers, transducers, ultrasonic receivers and ultrasonic generators, etc. As a result of the increased demand for piezoelectric elements, there is an increasing use of piezoelectric ceramic compositions to form the elements. The different uses or applications require different electromechanical characteristics from the piezoelectric ceramics. Additionally, there is a continued drive towards increasingly smaller electronic components, causing an increased demand for smaller piezoelectric elements for use in these electronic components. However, many of the smaller electronic components require that the piezoelectric elements provide the same or even greater output power, despite their reduced size.

Existing high power piezoelectric ceramics often do not exhibit suitable electromechanical properties for use in miniaturized electronic devices, such as miniaturized ultrasonic devices. In the current state of the art, the existing piezoelectric elements that are sufficiently small to be used in the miniaturized devices exhibit low capacitance and high electrical impedance. This is inadequate to drive the miniaturized devices. Additionally, if the permittivity is high, the dielectric loss factor (tan δ) of the current piezoelectric elements is also high—resulting in internal heating and dissipative loss which significantly decreases the efficiency and output of the device. Consequently, existing piezoelectric ceramics have not provided adequate electromechanical properties for these miniaturized electronic devices.

The electromechanical properties of the piezoelectric ceramics can be altered by varying the specific ceramic composition, the molecular structure, and/or the methods and parameters for fabricating the piezoelectric ceramic.

Common piezoelectric ceramics can be formed from a variety of general classes or types of ceramics. One class is a lead-zirconium titanate ceramic (PZT); another class is a lead-magnesium niobium ceramic (PMN). In many cases, solid solutions of either the PZT or the PMN ceramic are prepared in which dopants are distributed either homogeneously or inhomogeneously in the general PZT or PMN ceramic. The dopants can be found in the interstitial spaces of the crystal units of the bulk matrix. They can modify characteristics to the resulting piezoelectric ceramic, including the Curie temperature, the mechanical quality factor, the dielectric dissipation factor, and the dielectric strain constant, among others.

In light of the above problems, there is a continuing need for advances in the relevant field including new piezoelectric ceramic compositions and piezoelectric elements formed from the compositions. The present invention addresses that need and provides a wide variety of benefits and advantages.

SUMMARY OF THE INVENTION

Briefly describing one aspect of the present invention, there is provided a class of novel ceramic compositions illustrated by Formula 1 below:

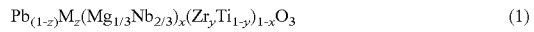

$$Pb_{(1-z)}M_z(Mg_{1/3}Nb_{2/3})_x(Zr_yTi_{1-y})_{1-x}O_3 \qquad (1)$$

wherein M is selected to be either Sr or Ba, x is selected to be between 0.3 and 0.6, y is selected to be between 0.20 and 0.50, and z is selected to be between 0.04 and about 0.10. In some embodiment of the above composition, one or more dopants are added to the compositions. The dopants can be selected from the group comprising: $MnO_2$, $Ni_2O_3$, $TeO_2$, $Sm_2O_3$, $HfO_2$, $WO_3$, $V_2O_5$, CdO, or $Tm_2O_3$ and mixtures thereof. The dopants can be added to the ceramic composition in individual amounts ranging from 0.01 wt % and 2.0 wt %.

The preferred ceramic compositions of the present invention exhibit suitable electromechanical properties for use as piezoelectric elements in miniaturized electronic devices. The preferred piezoelectric ceramics of the invention exhibit one or more of the following electromechanical properties: a relative permittivity ($\epsilon$) of between 2500 and 3500, a mechanical quality factor ($Q_m$) of between 500 and 1500, a piezoelectric strain constant ($d_{33}$) of between 300-600 pC/N, a dielectric loss factor (tan δ) of between 0.002-0.008 and a thickness electromechanical coupling coefficient ($k_t$) of between 0.4 and 0.7. Additionally, the preferred pervoskite ceramics of the present invention have a Curie temperature value of between about 200 and about 300° C.

It is an object of the present invention to provide high power piezoelectric ceramics.

Further objects, features, aspects, forms, advantages, and benefits shall become apparent from the description and drawings contained herein.

DETAILED DESCRIPTION

For the purposes of promoting an understanding of the principles of the invention, specific preferred embodiments will be described. It will nevertheless be understood that no limitation of the scope of the invention is thereby intended. Any alterations and further modifications in the described compositions, elements, processes, or devices, and any further applications of the principles of the invention as described herein are contemplated as would normally occur to one skilled in the art to which the invention relates.

The present invention provides novel compositions of piezoelectric ceramics that have advantageous use for high power applications. Existing high power piezoelectric ceramics do not exhibit suitable electromechanical properties for use in miniaturized devices, such as ultrasonic devices. With the miniature devices, the element sizes are often small causing the resulting capacitance of the piezoelectric ceramic to be too small and the electrical impedance too high for useful or adequate electrical driving of many electrical devices. In contrast, the preferred compositions of the present invention exhibit a high permittivity ($\epsilon_r$) and/or a high mechanical quality factor ($Q_m$). This, in turn, provides a high capacitance and low impedance for high electrical driving. The preferred compositions also exhibit a large piezoelectric strain constant ($d_{33}$), allowing a relatively small element to produce a large mechanical displacement. Additionally, the dielectric loss factor (tan δ) is sufficiently low to minimize internal heating effects, which can drain electrical power from the device and, in the worst case, cause the device to ultimately fail.

In preferred embodiments of the present invention, the piezoelectric ceramics can be used to form piezoelectric elements that can produce significantly greater amount of acoustical power than the current state-of-the-art high power piezoelectric ceramics having the same sized element. Alternatively, the present invention can provide piezoelectric ceramics for use in microelectronics and can be used to produce a much smaller element while providing the same acoustical power output as significantly larger elements.

The present invention provides a novel piezoelectric ceramic composition. Preferably, the novel piezoelectric ceramic composition is a composite perovskite crystal structure. In preferred embodiments, the composite perovskite ceramic provides a unique crystal structure as a single-phase ceramic composition. The term "composite perovskite crystal structure," is intended to encompass ceramic compositions exhibiting a unique crystal structure prepared by combining the selected elements in a unique, stoichiometric ratio. In this structure, each element or type of element is located at a crystallographically predictable or determinable site, typically a lattice site within the crystal structure. Consequently, in one embodiment, the piezoelectric ceramic composition does not exhibit the same properties normally exhibited by a solid solution of metals, or metal oxides, in a ceramic matrix.

In other embodiments, the preferred piezoelectric ceramic composition of the present invention exists as a composite perovskite crystal structure with one or more added dopants which may be located in the interstitial sites of the crystal lattice. The added dopants are discussed more fully below.

The preferred formula for the ceramic composition, which can be made piezoelectric according to the present invention is illustrated below in Formula 1:

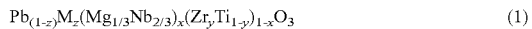

$$Pb_{(1-z)}M_z(Mg_{1/3}Nb_{2/3})_x(Zr_yTi_{1-y})_{1-x}O_3 \quad (1)$$

where M is selected to be either Sr or Ba, x is between 0.3 and 0.6, y is between 0.20 and 0.50, and z is between 0.04 and 0.10. In alternative embodiments, x can be selected to be between about 0.35 and 0.40, y is selected to be between 0.22 and 0.28, and z is selected to be between 0.07 and 0.08. A particularly preferred ceramic composition for the present invention is represented by the following formula:

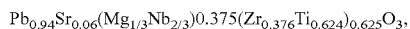

$$Pb_{0.94}Sr_{0.06}(Mg_{1/3}Nb_{2/3})0.375(Zr_{0.376}Ti_{0.624})_{0.625}O_3,$$

which also can be represented as:

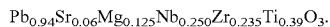

$$Pb_{0.94}Sr_{0.06}Mg_{0.125}Nb_{0.250}Zr_{0.235}Ti_{0.39}O_3.$$

The preferred composition of the present invention can be prepared by selecting metal containing precursors and combining the metal containing precursors in a selected relative ratio to provide the desired stoichiometric composition of Formula 1 above. The above formula can be thought of as the perovskite structure of the $ABO_3$ type. In this formula type, the stoichiometric ratio of the A type element or component to the B type element or component is 1:1. In accordance with this construct, the metals Pb and M (where M is either strontium or barium) in Formula 1 above can be represented by the identifier A. Similarly, the identifier B can be represented by the combination of (Mg/Nb) and (Zr/Ti). Consequently for the present invention, the relative molar ratio of the A component, [Pb(Sr/Ba)], to the B component, [(Mg/Nb) and (Zr/Ti)], is about 1:1.

Within this construct, the relative atomic ratio of Pb to M (either Sr or Ba) can be selected and varied to provide a composition with the desired electromechanical properties. In a preferred embodiment, the relative atomic ratio of Mg to Nb is preselected to be 1:2 Mg:Nb. The relative atomic ratio of Zr to Ti can range from 1:1 to 1:4 (Zr:Ti).

Further, the relative ratio of the (Mg/Nb) component to the (Zr/Ti) component can vary. In a preferred embodiment, the relative ratio of (Mg/Nb) to (Zr/Ti) can be varied or selected to be between 3:7 to 3:2.

As noted above, the relative ratios of the metals in the ceramic can be varied to affect the desired electromechanical properties. Preferably, the relative ratios are selected to provide a ceramic composition exhibiting a structure that lies near or at the morphotropic phase boundary (MPB) area. The MPB delineates two solid phases, e.g., a tetragonal phase and a rhombohedral phase, that remain in a near-equilibrium state over a wide temperature range.

The preferred metal precursors for the present invention are selected to be metal oxides or metal carbonates. Preferably, the metal precursors are available as PbO, MgO, $Nb_2O_5$, $ZrO_2$, and $TiO_2$. Additionally, $SrCO_3$ and $BaCO_3$ can be used as the precursors for Sr and Ba. These metal precursors are commercially available from a number of commercial vendors and in various levels of purity. It is preferred that the metal precursors be at least 99.95% pure.

In other embodiments, the ceramic of the present invention can include one or more dopant materials. The dopant materials can be selected to modify and enhance the electromechanical properties of the resulting piezoelectric ceramic. Alternatively, one or more of the dopants can be added to the precursors to facilitate and/or ease processing steps to formulate the desired ceramic. The dopants can be added to the present composition in individual amounts up to 2 percent by weight (wt %) based upon the total weight of the piezoelectric ceramic material. More preferably the dopants are included in the ceramic compositions in individual amounts between 0.5 wt % and 1.75 wt % based upon the total weight of the starting, precursor materials. Examples of the dopants for use in the present invention include manganese, nickel, hafnium, tellurium, tungsten, vanadium, cadmium, thulium, and samarium ceramics. More preferably, the dopants are provided by one or more of the following dopant precursors: PbO, $MnO_2$, $Ni_2O_3$, $HfO_2$, $TeO_2$, $WO_3$, $V_2O_5$, CdO, $Tm_2O_3$, and $Sm_2O_3$. One preferred composition includes about 1.0 wt % PbO, based upon the total weight of the starting precursor. Another preferred composition includes 0.4 to 0.6, most preferably 0.5, wt % $MnO_2$. Other preferred compositions include 0.3 to 1.0, most preferably 0.5, wt % $Ni_2O_3$.

In other embodiments, one or more different piezoelectric compositions (such as PZT4, PZT8, a composite variety, a single crystal of piezoelectric, and/or a piezoelectric polymer just to name a few non-limiting examples) can be alternatively, or additionally, utilized for the present invention as would occur to those skilled in the art.

The resulting piezoelectric ceramic can be further processed as desired. In one form, the piezoelectric ceramic is used as a monolithic ceramic or billet for a particular device. Electrodes can be patterned on monolithic ceramic to provide a single piezoelectric element. In other embodiments, two, three, or more piezoelectric ceramic articles can be combined or laminated together. Each of the laminates typically contains separate electrodes. The laminate elements can be used to form a device such as actuators or projectors. In yet other embodiments, the piezoelectric ceramic can either be cut into a number of smaller units or combined with a number of different piezoelectric ceramics that either have the same or different electromechanical properties. Electrodes can be patterned on each of the smaller units or different piezoelectric ceramics, which can be combined to form a multi-element array.

In any of these applications, electrodes are deposited on the piezoelectric ceramic positioned and sized for the particular use of the resulting electronic device. Examples of electronic devices that can utilize the piezoelectric ceramics of the present invention are described and illustrated in U.S. patent application Ser. No. 10/686,120 filed on Oct. 15, 2003, and entitled "Miniature Ultrasonic Phased Array for Intracardiac and Intracavity Applications"; U.S. Provisional Patent Application Ser. No. 60/478,649, filed on Jun. 13, 2003, and entitled "Multi-Element Array for Acoustic Ablation"; and U.S. patent application Ser. No. 60/475,144, filed on Jun. 1, 2003, now issued as U.S. Pat. No. 7,195,179 and entitled "Droplet Generation with a Piezoelectric Device," all of which are incorporated by reference herein in their entirety.

As indicated above, the preferred ceramic compositions of the present invention exhibit electromechanical properties suitable for use as piezoelectric elements in miniaturized electronic devices. For example, the most preferred piezoelectric ceramics exhibit one or more of the following electromechanical properties: a relative permittivity ($\epsilon$) of between 2500 and 3500, a mechanical quality factor ($Q_m$) of between 500 and 1500, a piezoelectric strain constant ($d_{33}$) of between 300-600 pC/N, a dielectric loss factor (tan $\delta$) of between 0.002-0.008 and a thickness electromechanical coupling coefficient ($k_t$) of between 0.4 and 0.7. In some preferred embodiments the compositions are prepared to provide a relative permittivity ($\epsilon$) of about 2800, a mechanical quality factor ($Q_m$) of about 800, a piezoelectric strain constant ($d_{33}$) of about 500 pC/N, and a dielectric loss factor (tan $\delta$) of about 0.006. Additionally, the most preferred pervoskite ceramics of the present invention have a Curie temperature value of between about 200 and about 300° C.

For the purpose of promoting further understanding and appreciation of the present invention and its advantages, the following Examples are provided. It will be understood, however, that these Examples are illustrative and not limiting in any fashion.

For the following examples, the measurements were performed on a computer-controlled Hewlett-Packard 4149A impedance/gain-phase analyzer. The measured parameters were a dielectric constant (K'), a dielectric loss factor (tan $\delta$), a mechanical quality factor ($Q_m$), relative permittivity ($\epsilon$) ($\epsilon$=K'-1~=K'), a thickness coupling coefficient ($K_t$), and a planar coupling coefficient ($K_p$). The density of the ceramic samples was measured by weighing the individual samples and determining the volume of the individual samples. The Berlincourt $d_{33}$ meter was used to determine the piezoelectric strain constant.

EXAMPLE 1

The following powdered ceramics were combined: PbO, 670.9 g; $ZrO_2$, 95.7 g; $TiO_2$, 96.1 g; $Nb_2O_5$, 105.0 g; MgO, 18.33 g; $SrCO_3$, 28.14 g; and $MnO_2$, 4.0 g. This combination of powders includes 1 wt % PbO and 0.4 wt % $MnO_2$ as dopant precursors.

The powders were suspended in 900 ml of deionized water and ball milled for about 16 hours. The resulting powdered slurry was then dried at 130° C. The dried powder was calcined at 950° C. for 3 hours. Thereafter the calcined ceramic powder was cooled to ambient temperature. The resulting ceramic was then re-pulverized by suspending in 600 ml of deionized water and ball milling for 7 hours. The pulverized ceramic was again dried at 130° C. to evaporate the water. The dried powder was suspended in a 5% polyvinyl alcohol (PVA) solution to provide a paste. This paste was extruded through a 1" slotted die under 1000 lb force to form a ceramic billet. This ceramic billet was fired at 1240° C. for 2.5 hours to produce the ferroelectric ceramic. Thereafter the ceramic billet was cooled to ambient temperature. Silver electrodes were patterned on the ceramic billet according to standard procedures. The resulting billet was then poled (polarized) at 115° C. and 60-80 V/mil for about 10 minutes. The electromechanical properties of the resulting piezoelectric ceramic were evaluated and are listed below in Table 1.

EXAMPLE 2

The following powdered ceramics were combined: PbO, 671.3 g; $ZrO_2$, 93.8 g; $TiO_2$, 97.4 g; $Nb_2O_5$, 105.0 g; MgO, 18.34 g, $SrCO_3$, 28.16 g; and $MnO_2$, 4.0 g. This combination of powders includes 1 wt % PbO and 0.4 wt % $MnO_2$ as dopant precursors.

The powders were suspended in 900 ml of deionized water and ball milled for about 16 hours. The resulting powdered slurry was then dried at 130° C. The dried powder was calcined at 950° C. for 3 hours. Thereafter calcined ceramic powder was cooled to ambient temperature. The resulting ceramic was then re-pulverized by suspending in 600 ml of deionized water and ball milling for 7 hours. The pulverized ceramic was again dried at 130° C. to evaporate the water. The dried powder was suspended in a 5% polyvinyl alcohol (PVA) solution to provide a paste. The paste was extruded through a 1" slotted die under 1000 lb. force to form a ceramic billet, which was then "bisqued" at 600° C. in a kiln. This ceramic billet was fired at 1240° C. for 2.5 hours. Thereafter the ceramic billet was cooled to ambient temperature.

Silver electrodes were patterned on the ceramic billet according to standard procedures. The resulting billet was then poled (polarized) at 90° C. to 110° C. and 60-80 V/mil for about 10 minutes. The electromechanical properties of the resulting piezoelectric ceramic were evaluated and are listed below in Table 1.

EXAMPLE 3

The following powdered ceramics were combined: PbO, 662.2 g; $ZrO_2$, 97.9 g; $TiO_2$, 95.1 g; $Nb_2O_5$, 105.3 g; MgO, 18.4 g; $SrCO_3$, 35.3 g; $Ni_2O_3$ 5.0 g; and $MnO_2$, 5.0 g. This combination of powders includes 1 wt % PbO and 0.5 wt % $MnO_2$ and 0.5 wt % $Ni_2O_3$ as dopant precursors.

The powders were suspended in 900 ml of deionized water and ball milled for 18 hours. The resulting powdered slurry was then dried at 130° C. The dried powder was calcined at 950° C. for 4 hours. Thereafter calcined ceramic powder was cooled to ambient temperature. The resulting ceramic was then re-pulverized by suspending in 650 ml of deionized water and ball milling for 20 hours. The pulverized ceramic was again dried at 130° C. to evaporate the water. The dried powder was suspended in a 5% polyvinyl alcohol (PVA) solution to provide a paste, which was extruded under 3000 lb. force and "bisqued" as described in Example 2 to form a ceramic billet. This ceramic billet was fired at 1260° C. for 2.5 hours. Thereafter the ceramic billet was cooled to ambient temperature. The ceramic billet was again fired at 950° C. for 2.5 hours.

Silver electrodes were patterned on the ceramic billet according to standard procedures. The resulting billet was then poled (polarized) at 110° C. and 60-80 V/mil for about 10 minutes. The electromechanical properties of the resulting piezoelectric ceramic were evaluated and are listed below in Table 1.

TABLE 1

| Example | Density ρ g/ml | Relative Permittivity ϵ (F/m) | Mechanical Quality Factor $Q_m$ | Piezoelectric Strain Constant $d_{33}$ (pC/N) | Dielectric Loss Factor tan δ | Coupling Constant $K_t$ | Planar Coupling Constant $K_p$ |
|---|---|---|---|---|---|---|---|
| 1 | 7.59 | 3278 | 806 | 504 | 0.006 | 0.49 | 0.56 |
| 2 | 7.65 | 3200 | 855 | 467 | 0.007 | 0.51 | 0.54 |
| 3 | 7.62 | 3320 | 640 | 490 | | | |

The present invention contemplates modifications as would occur to those skilled in the art. It is also contemplated that fabrication processes embodied in the present invention can be altered, rearranged, or added to other processes as would occur to those skilled in the art without departing from the spirit of the present invention.

All publications, patents, and patent applications cited in this specification are herein incorporated by reference as if each individual publication, patent, or patent application was specifically and individually indicated to be incorporated by reference and set forth in its entirety herein.

Further, any theory of operation, proof, or finding stated herein is meant to further enhance understanding of the present invention and is not intended to make the scope of the present invention dependent upon such theory, proof, or finding.

While the invention has been illustrated and described in detail and foregoing examples, the same is considered to be illustrative and not restrictive in character, it is understood that only the preferred embodiments have been shown and described and that all changes and modifications that come within the spirit of the invention are desired to be protected.

What is claimed is:

1. A PZT-type piezoelectric ceramic composition consisting essentially of Pb, Sr, Mg, Nb, Zr, Ti, and Mn in the following relative amounts:

$Pb_{0.93}Sr_{0.06}Mg_{0.14}Nb_{0.24}Zr_{0.24}Ti_{0.37}Mn_{0.01}$.

2. A PZT-type piezoelectric ceramic composition consisting essentially of Pb, Sr, Mg, Nb, Zr, Ti, Mn, and Ni in the following relative amounts:

$Pb_{0.93}Sr_{0.06}Mg_{0.14}Nb_{0.24}Zr_{0.24}Ti_{0.38}Mn_{0.01}$.

3. A PZT-type piezoelectric ceramic composition consisting essentially of Pb, Sr, Mg, Nb, Zr, Ti, Mn, and Ni in the following relative amounts:

$Pb_{0.90}Sr_{0.07}Mg_{0.14}Nb_{0.24}Zr_{0.24}Ti_{0.36}Mn_{0.02}Ni_{0.02}$.

* * * * *